United States Patent
Shen et al.

(10) Patent No.: US 11,655,537 B2
(45) Date of Patent: May 23, 2023

(54) HDP SACRIFICIAL CARBON GAPFILL

(71) Applicant: Applied Materials, Inc., Santa Clara, CA (US)

(72) Inventors: Zeqing Shen, San Jose, CA (US); Bo Qi, San Jose, CA (US); Abhijit Basu Mallick, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 75 days.

(21) Appl. No.: 17/079,630

(22) Filed: Oct. 26, 2020

(65) Prior Publication Data

US 2022/0127718 A1 Apr. 28, 2022

(51) Int. Cl.
*C23C 16/04* (2006.01)
*C23C 16/505* (2006.01)
*H01L 21/768* (2006.01)

(52) U.S. Cl.
CPC .......... *C23C 16/045* (2013.01); *C23C 16/505* (2013.01); *H01L 21/76837* (2013.01)

(58) Field of Classification Search
None
See application file for complete search history.

(56) References Cited

U.S. PATENT DOCUMENTS

| | | | |
|---|---|---|---|
| 5,872,058 A | 2/1999 | Van Cleemput et al. | |
| 6,218,288 B1 * | 4/2001 | Li | H01L 21/76877 438/653 |
| 6,297,554 B1 | 10/2001 | Lin | |
| 6,759,297 B1 * | 7/2004 | Dvorsky | B82Y 10/00 438/626 |
| 7,541,297 B2 | 6/2009 | Mallick et al. | |
| 7,704,897 B2 | 4/2010 | Mungekar et al. | |
| 8,557,712 B1 | 10/2013 | Antonelli et al. | |
| 8,728,958 B2 | 5/2014 | Ashtiani et al. | |
| 9,023,719 B2 | 5/2015 | Pachamuthu et al. | |
| 9,177,966 B1 | 11/2015 | Rabkin et al. | |
| 9,355,886 B2 | 5/2016 | Swaminathan et al. | |
| 10,192,775 B2 | 1/2019 | Manna et al. | |
| 2002/0037635 A1 | 3/2002 | Li et al. | |
| 2007/0264819 A1 | 11/2007 | Offenberg et al. | |
| 2009/0075454 A1 | 3/2009 | Ang | |
| 2011/0034039 A1 | 2/2011 | Liang et al. | |
| 2011/0159213 A1 | 6/2011 | Cai et al. | |
| 2014/0045342 A1 | 2/2014 | Mallick et al. | |

(Continued)

FOREIGN PATENT DOCUMENTS

EP 1209739 A2 5/2002

OTHER PUBLICATIONS

"PCT International Search Report and Written Opinion in PCT/US2021/055125 dated Feb. 9, 2022, 11 pages".

(Continued)

*Primary Examiner* — Shamim Ahmed
*Assistant Examiner* — Bradford M Gates
(74) *Attorney, Agent, or Firm* — Servilla Whitney LLC

(57) ABSTRACT

Methods for filling a substrate feature with a carbon gap fill, while leaving a void, are described. Methods comprise flowing a process gas into a high density plasma chemical vapor deposition (HDP-CVD) chamber, the chamber housing a substrate having at least one feature, the process gas comprising a hydrocarbon reactant, generating a plasma, and depositing a carbon film.

19 Claims, 10 Drawing Sheets

(56) References Cited

U.S. PATENT DOCUMENTS

| | | |
|---|---|---|
| 2014/0094035 A1* | 4/2014 | Ji .......................... C23C 16/045 |
| | | 204/298.38 |
| 2014/0284697 A1 | 9/2014 | Wang et al. |
| 2015/0079765 A1* | 3/2015 | Pachamuthu ..... H01L 27/11556 |
| | | 438/478 |
| 2016/0314964 A1 | 10/2016 | Tang et al. |
| 2019/0181004 A1 | 6/2019 | Tang et al. |
| 2019/0206723 A1* | 7/2019 | Tokashiki ......... H01L 21/31116 |
| 2019/0259772 A1 | 8/2019 | Takahashi et al. |

OTHER PUBLICATIONS

Kim, Honggun, et al., "Novel Flowable CVD Process Technology for sub-20nm Interlayer Dielectrics".

Yan, Yan, et al., "Flowable CVD Process Application for Gap Fill at Advanced Technology", ECS Transactions, 60 (1) 503-506 (2014).

\* cited by examiner

HDP SACRIFICIAL CARBON GAPFILL

TECHNICAL FIELD

Embodiments of the disclosure generally relate to methods for filling substrate features. More particularly, embodiments of the disclosure are directed to methods for filling features with carbon using a high density plasma chemical vapor deposition (HDP CVD) chamber.

BACKGROUND

In microelectronics device fabrication there is a need to fill narrow trenches having aspect ratios (AR) greater than 10:1 with no voiding for many applications. One application is for shallow trench isolation (STI). For this application, the film needs to be of high quality throughout the trench (having, for example, a wet etch rate ratio less than two) with very low leakage. One method that has had past success is flowable CVD. In this method, oligomers are carefully formed in the gas phase which condense on the surface and then "flow" into the trenches. The as-deposited film is of very poor quality, however, and requires processing steps such as steam anneals and UV-cures.

Ultra-high density storage devices can be produced using three-dimensional (3D) stacked memory structures. For example, a 3D NAND stacked memory device can be formed from an array of alternating conductive and dielectric layers. A memory hole is formed through the memory layers, and a NAND string is formed by filling the memory hole with appropriate materials. As the dimensions of the structures decrease and the aspect ratios increase, post curing methods of the as deposited films become difficult.

Both logic and memory applications require a carbon gap fill process. Carbon material can be removed using plasma etch, without affecting underlayer materials. In multi-tier 3D NAND production, a sacrificial memory hole plug process is desired to protect bottom tier memory holes and deposit upper tier on top of the bottom tiers. Such process needs to meet requirements of throughput, dry etch removability and high temperature (~850° C.) stability. Current amorphous silicon (aSi) sacrificial fill has multiple integration issues. Accordingly, there is a need for a gap fill process which provides an amorphous carbon material that is stable at high temperature.

SUMMARY

One or more embodiments of the disclosure are directed to a method of forming a film. The method comprises flowing a process gas into a high density plasma chemical vapor deposition (HDP-CVD) chamber, the chamber housing a substrate having at least one feature, the process gas comprising a hydrocarbon reactant having a hydrogen to carbon (H:C) ratio that is less than or equal to 2:1 and one or more of hydrogen ($H_2$), helium (He), and argon (Ar), the substrate processed at a temperature in a range of from about 400° C. to about 650° C. and a pressure of less than about 50 mTorr; generating a plasma by source RF; ions being accelerated by the bias RF, and depositing a carbon film in the at least one feature, the carbon film having a void in the at least one feature. RF energy is coupled into the chamber through coils inductively and generating high density plasma.

Another embodiment of the disclosure is directed to method of forming a film. The method comprises: flowing a process gas into a high density plasma chemical vapor deposition (HDP-CVD) chamber, the chamber housing a substrate having a substrate surface, the process gas comprising a hydrocarbon reactant having a hydrogen to carbon (H:C) ratio that is less than or equal to 2:1 and one or more of hydrogen ($H_2$), helium (He), and argon (Ar); generating a plasma by source RF; ions being accelerated by the bias RF; and depositing a carbon film on the substrate surface, the substrate surface having at least one feature thereon, the at least one feature extending a feature depth from the substrate surface to a bottom surface, the at least one feature having a width defined by a first sidewall and a second sidewall, wherein the first film is deposited on the substrate surface, the first sidewall, the second sidewall, and the bottom surface of the at least one feature, the carbon film having a void located within the width of the feature at a first distance from the bottom surface of the feature.

Other embodiments of the disclosure are directed to a method of manufacturing a memory device. In one or more embodiments, the method comprises: forming a film stack on a substrate, the film stack comprising a plurality of alternating layers of first material and a second material and the film stack having a stack thickness; etching the film stack to form a memory hole opening extending a depth from a top of the film stack surface to a bottom surface, the memory hole opening having a width defined by a first sidewall and a second sidewall; loading the substrate into a high density plasma chemical vapor deposition (HDP-CVD) chamber; flowing a process gas into the high density plasma chemical vapor deposition (HDP-CVD) chamber, the process gas comprising a hydrocarbon reactant having a hydrogen to carbon (H:C) ratio that is less than or equal to 2:1 and one or more of hydrogen ($H_2$), helium (He), and argon (Ar), the film stack at a temperature in a range of from about 400° C. to about 650° C. and at a pressure of less than about 50 mTorr; and depositing a carbon film on the film stack surface, and on the first sidewall, the second sidewall, and the bottom surface of the memory hole opening, the carbon film having a void located within the width of the memory hole opening at a first distance from the bottom surface of the memory hole opening.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1A:
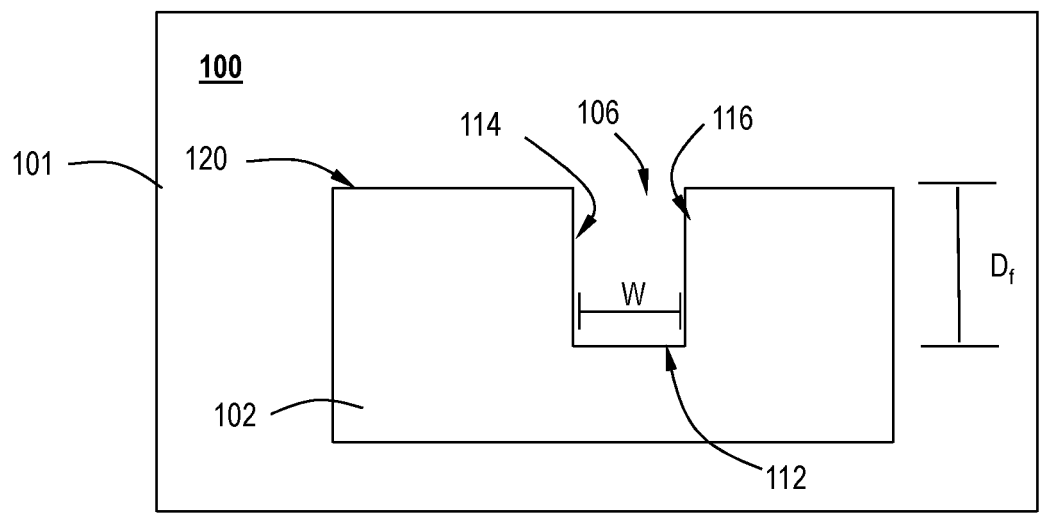
FIGS. 1A through 1D illustrate cross-sectional views of a substrate in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

V-NAND, or 3D-NAND, structures are used in flash memory applications. V-NAND devices are vertically stacked NAND structures with a large number of cells arranged in blocks. As used herein, the term "3D NAND" refers to a type of electronic (solid-state) non-volatile computer storage memory in which the memory cells are stacked in multiple layers. 3D NAND memory generally includes a plurality of memory cells that include floating-gate transistors. Traditionally, 3D NAND memory cells include a plurality of NAND memory structures arranged in three dimensions around a bit line.

A critical step in 3D NAND technology is the ability to deposition additional tiers vertically to increase the capability. In multi-tier 3D NAND production, a sacrificial memory hole plug process is needed to protect bottom tier memory holes. Memory holes needs to be filled with certain material and be planarized before subsequent processes. Such process needs to meet requirements of throughput, dry etch removability and high temperature (e.g. 850° C.) stability.

Other approaches include amorphous silicon-based processes or other amorphous carbon-based processes. Amorphous silicon material requires a wet removal process, which deleteriously affects oxide/nitride stacks. Other amorphous carbon materials suffer from low deposition rates, slow throughput, and instability at high temperature.

Embodiments of the disclosure provide methods of depositing a film (e.g., amorphous-carbon (a-C)) in high aspect ratio (AR) features with small dimensions using a high density plasma chemical vapor deposition (HDP-CVD) chamber. Some embodiments advantageously provide sacrificial carbon films to fill up high AR trenches with small dimensions while leaving a void in the trench/feature. The sacrificial carbon film of one or more embodiments has high thermal stability at annealing temperatures.

Provided herein are methods of filling gaps using high density plasma chemical vapor deposition (HDP CVD). According to various implementations, carbon-containing films such as amorphous carbon films are deposited by HDP CVD into gaps on substrates to fill the gaps. In one or more embodiments, the methods may involve using low hydrogen content process gasses during HDP CVD deposition to provide gap fill. The amorphous carbon material of one or more embodiments can be easily removed via oxygen ($O_2$) plasma, eliminating impacts on the oxide/nitride stack.

In one or more embodiments, the feature is selected from a trench, a via, a word-line slit, and a memory hole. In specific embodiments, the feature is a memory hole. In very specific embodiments, the feature is a memory hole in a NAND device. In one or more embodiments, the feature is filled, i.e. gap fill. In some embodiments, the gap fill is performed by HDP CVD.

High density plasma chemical vapor deposition (HDP CVD) is a directional CVD process that involves directing charged precursor species toward a substrate. High density plasma chemical vapor deposition (HDP-CVD), as used herein, is distinct from plasma enhanced chemical vapor deposition techniques, also known as PECVD. HDP-CVD reactors typically employ inductively-coupled plasmas, while PECVD reactors typically employ capacitively-coupled plasmas. HDP-CVD process conditions and resulting films are different PECVD processes. For example, various HDP reactors as described herein operate at a pressure less than about 50 mTorr with a plasma density greater than $10^{17}$ ions/m$^3$, e.g., $10^{17}$ ions/m$^3$ to $10^{19}$ ions/m$^3$. By contrast, PECVD processes operate at much higher pressures with much lower plasma densities, e.g., $10^{14}$ ions/m$^3$ to $10^{16}$ ions/m$^3$.

HDP reactors may ignite plasma at a plasma frequency of 2 MHz for coils and a frequency of 13.56 MHz for the pedestal where the wafer is placed. By contrast, in a capacitively-coupled plasma reactor, a plasma frequency of 13.56 MHz is used to generate plasma as applied to either a showerhead or the pedestal, and 2 MHz is applied to either the showerhead or the pedestal. Ion energies in HDP reactors may be greater than in PECVD reactors. As a result, film composition and characteristics of films deposited in HDP-CVD reactors are different than those deposited in PECVD reactors. For carbon-based gap fill, the lower plasma densities in PECVD typically cannot generate sufficient dissociation to allow high throughput.

In one or more embodiments, substrate temperature during processing may be in a range of from about 400° C. to about 650° C., or in a range of from about 510° C. to about 650° C. In one or more embodiments, the chamber pressure is maintained at a value below 50 mTorr, or below 40 mTorr, or below 30 mTorr, or below 20 mTorr, or below 10 mTorr. In one or more embodiments, the substrate temperature is controlled by the density of the ion species, the pressure, and the bias power.

In one or more embodiments, a high frequency RF power source or other source may be used to bias the substrate. Substrates are typically biased during deposition operations to direct charged species downward, to the bottom of the feature, e.g. memory hole. In one or more embodiments, bias powers during HDP CVD are in a range of from about 0 to 9500 W, with bias power scaling with substrate surface area. In one or more embodiments, bias power and pressure are crucial to engineering the void size and position.

FIG. 1A illustrates a partial cross-sectional view of an electronic device 100 according to one or more embodiments. In some embodiments, a substrate 102 with a feature 106 is provided for processing in a HDP-CVD processing chamber 101. As used in this specification and the appended claims, the term "provided" means that the substrate is made available for processing (e.g., positioned in a processing chamber). The Figures show substrates having a single feature for illustrative purposes; however, those skilled in the art will understand that there can be more than one feature. The shape of the feature 106 can be any suitable shape including, but not limited to, trenches and cylindrical vias. As used in this regard, the term "feature" means any intentional surface irregularity. Suitable examples of features include, but are not limited to trenches, word-line slits, and memory holes, which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 40:1, or 45:1, or 50:1, or 55:1, or 60:1, or 65:1, or 70:1, or 75:1, or 80:1, or 85:1, or 90:1, or 95:1, or 100:1.

In one or more embodiments, the substrate 102 has a substrate surface 120. The at least one feature 106 forms an opening in the substrate surface 120. The at least one feature 106 extends from the substrate surface 120 to a feature depth $D_f$ to a bottom surface 112. In one or more embodiments, the depth $D_f$ of the at least one feature is in a range of about 50 nm to about 10000 nm.

The at least one feature 106 has a first sidewall 114 and a second sidewall 116 that define a width, W, of the at least one feature 106. The open area formed by the sidewalls 114, 116 and bottom surface 112 are also referred to as a gap. In one or more embodiments, the width, W, is homogenous along the depth $D_f$ of the at least one feature 106. In other embodiments, the width, W, is greater at the top of the at least one feature 106 than the width, W, at the bottom surface 112 of the at least one feature 106.

In one or more embodiments, the at least one feature 106 comprises a memory hole or a word line slit. Accordingly, in one or more embodiments, the substrate 102 comprises a memory device or a logic device, e.g. NAND, VNAND, DRAM, or the like.

Figure 1B:
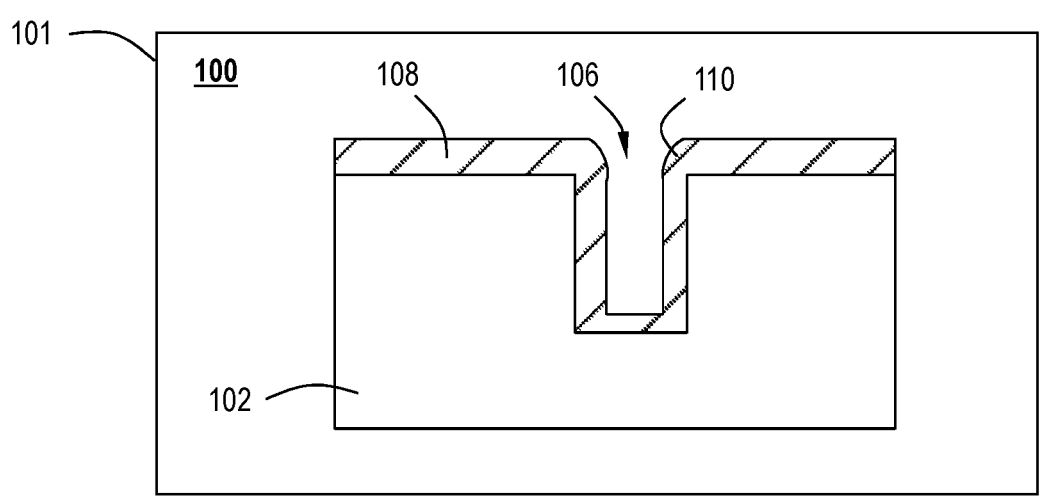
Figure 1C:
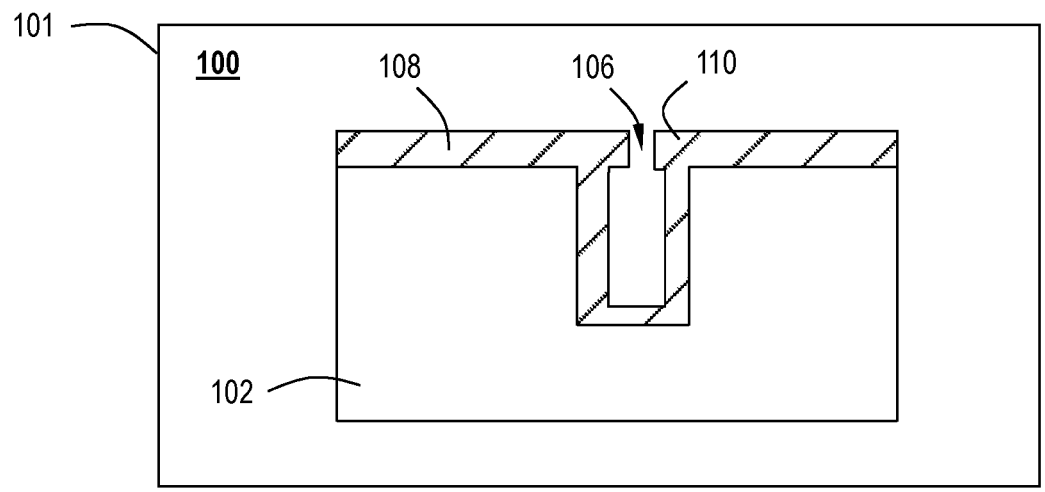
Figure 1D:
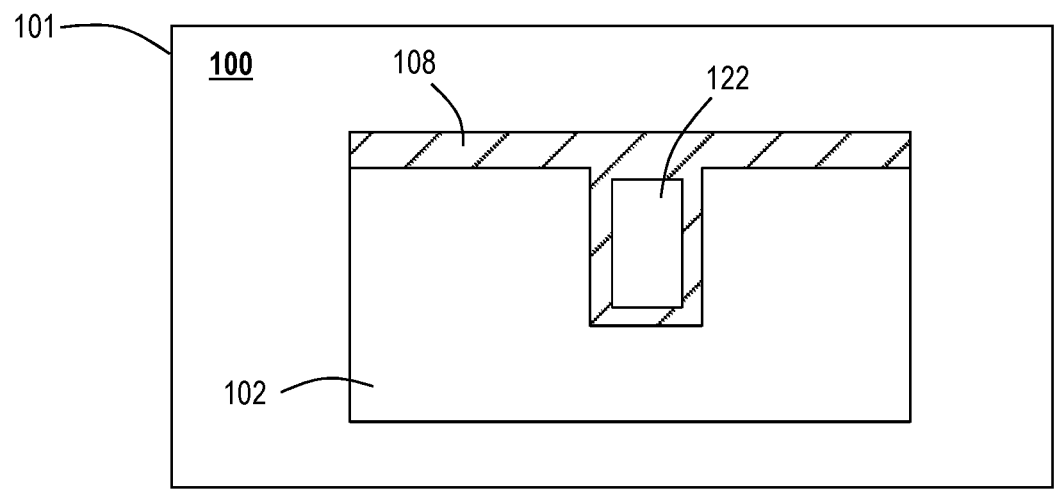

Referring to FIGS. 1B to 1D, in one or more embodiments, a carbon film 108 is formed on the substrate surface 120 and the walls 114, 116 and the bottom 112 of the at least one feature 106. As illustrated in FIGS. 1B to 1D, in one or more embodiments, the carbon film 108 has a void 122 located within the width, W, of the at least one feature 106.

In some embodiments, the carbon film 108 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

In one or more embodiments, the substrate 102 with the at least one feature 106 formed thereon is placed in an HDP-CVD chamber 101 for processing. In one or more embodiments, referring to FIG. 1B, a carbon film 108 is formed on the substrate surface 120 and the walls 114, 116 and the bottom 112 of the at least one feature 106.

In one or more embodiments, the carbon film 108 is formed by flowing a process gas into a high density plasma chemical vapor deposition (HDP-CVD) chamber 101. In one or more embodiments, the process gas comprises a hydrocarbon reactant having a hydrogen to carbon (H:C) ratio that is less than or equal to 2:1 and one or more of hydrogen ($H_2$), helium (He), and argon (Ar). In some embodiments, the process gas comprises a hydrocarbon reactant having a hydrogen to carbon (H:C) ratio that is less than or equal to 1:1.

In some embodiments, the hydrocarbon reactant comprises one or more of an alkene and an alkyne. As used herein, the term "alkene" refers to a hydrocarbon that contains a carbon-carbon double bond. An alkene is an acyclic hydrocarbon with just one double bond. As used herein, the term "alkyne" refers to an unsaturated hydrocarbon containing at least one carbon-carbon triple bond. In one or more embodiments, the hydrocarbon reactant is selected from the group consisting of acetylene ($C_2H_2$), propylene ($C_3H_6$), ethylene ($C_2H_4$), and methylacetylene ($C_3H_4$).

Non-limiting examples of the hydrocarbon process gases for depositing carbon films include acetylene ($C_2H_2$)/hydrogen ($H_2$)/helium (He)/argon (Ar), propylene ($C_3H_6$)/hydrogen ($H_2$)/helium (He)/argon (Ar), ethylene ($C_2H_4$)/hydrogen ($H_2$)/helium (He)/argon (Ar), and methylacetylene ($C_3H_4$)/hydrogen ($H_2$)/helium (He)/argon (Ar).

A carbon film 108 is then deposited to in the feature 106 and forms on the sidewalls 114, 116, and bottom 112, but leaves a void 122 in the at least one feature 106. According to various embodiments, filling the gap may be performed in a single deposition or in multiple depositions.

In one or more embodiments, by using a hydrocarbon process gas in an HDP CVD deposition, gap fill may be provided. This is schematically represented in FIGS. 1A to 1D, which depict cross-sectional diagrams of a feature 106 filled with a carbon film 108 in a deposition stage using. As the deposition proceeds, a cusping 110 from re-deposition and preferential growth forms. This leads to the closing off of the top of the feature 106, which in turn results in a void 122.

The void 122 is illustrated as a rectangular opening in the carbon film 108. Those skilled in the art, however, will understand that this is merely for illustrative purposes. The shape and size of the void 122 can vary.

In one or more embodiments, the hydrocarbon process gas is flowed into the HDP-CVD processing chamber with a flow rate in a range of from about 10 sccm to about 150 sccm, including from about 15 sccm to about 135 sccm. Standard cubic centimeters per minute (sccm) is a unit of flow measurement indicating cubic centimeters per minute ($cm^3$/min) in standard conditions for temperature and pressure of a given fluid, typically a gas.

In one or more embodiments, argon (Ar) is introduced/flowed into the HDP-CVD chamber with a flow rate in a range of from about 40 sccm to about 60 sccm. In one or more embodiments, hydrogen ($H_2$) is introduced/flowed into the HDP-CVD chamber with a flow rate in a range of from about 0 sccm to about 500 sccm, including a range of from about 0 sccm to about 300 sccm, and from about 0 sccm to about 200 sccm. In one or more embodiments, helium (He) is introduced/flowed into the HDP-CVD chamber with a flow rate in a range of from about 0 sccm to about 500 sccm, and in a range of from about 0 sccm to about 300 sccm.

In one or more embodiments, the substrate is processed at a temperature in a range of from about 400° C. to about 650° C., and at pressure of less than about 50 mTorr. In some embodiments, the pressure is less than about 40 mTorr, or less than about 30 mTorr, or less than about 20 mTorr, or less than about 10 mTorr.

After the process gas is flowed into a HDP-CVD chamber, a plasma is generated to form the carbon film 108 in the at least one feature 106 and on the substrate surface 122.

In one or more embodiments, the carbon film 108 has excellent thermal stability. After annealing the carbon film 108 at a temperature greater than or equal to 800° C. for 1 hours, the carbon film 108 has shrinkage less than 15%. In some embodiments, the carbon film 108 has shrinkage less than 10%.

FIGS. 2A to 2E illustrate partial cross-sectional views of a memory device 200, e.g. NAND device, according to one or more embodiments. In some embodiments, a substrate 202 with a feature 214 is provided for processing in a HDP-CVD processing chamber 201. The shape of the feature 214 can be any suitable shape including, but not limited to, trenches and cylindrical vias. As used in this regard, the term "feature" means any intentional surface irregularity. Suitable examples of features include, but are not limited to trenches, word-line slits, and memory holes, which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 40:1, 45:1, 50:1, 55:1, 60:1, 65:1, 70:1, 75:1, 80:1, 85:1, 90:1, 95:1, or 100:1. In one or more embodiments, the feature 214 comprises a memory hole.

In one or more embodiments, the substrate 202 has a substrate surface 222. The at least one feature 214 forms an opening in the substrate surface 222. The at least one feature 214 extends from the substrate surface 222 to a feature depth $D_m$ to a bottom surface 220. The at least one feature 214 has a first sidewall 216 and a second sidewall 218 that define a width, $W_m$, of the at least one feature 214. In one or more embodiments, the width, $W_m$, is homogenous along the depth $D_m$ of the at least one feature 214. In other embodiments, the width, $W_m$, is greater at the top of the at least one feature 214 than the width, $W_m$, at the bottom surface 220 of the at least one feature 214.

In one or more embodiments, the at least one feature 214 comprises a memory hole or a word line slit. Accordingly, in one or more embodiments, the device 200 comprises a memory device or a logic device, e.g. NAND, VNAND, DRAM, or the like.

In one or more embodiments, the device 200 comprises is a film stack comprising a plurality of alternating layers of a first material 210 and a second material 212 deposited on a semiconductor substrate 202. In one or more embodiments, the first material 210 and the second material 212 independently comprise one or more of an oxide material, a nitride material, and a polysilicon material. In specific embodiments, the first material 210 is a nitride material and the second material 212 is an oxide material 212 deposited on a semiconductor substrate 202.

The semiconductor substrate 202 can be any suitable substrate material. In one or more embodiments, the semiconductor substrate 202 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), copper indium gallium selenide (CIGS), other semiconductor materials, or any combination thereof. In one or more embodiments, the semiconductor substrate 102 comprises one or more of silicon (Si), germanium (Ge), gallium (Ga), arsenic (As), indium (In), phosphorus (P), copper (Cu), or selenium (Se). Although a few examples of materials from which the substrate 202 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

Figure 2A:
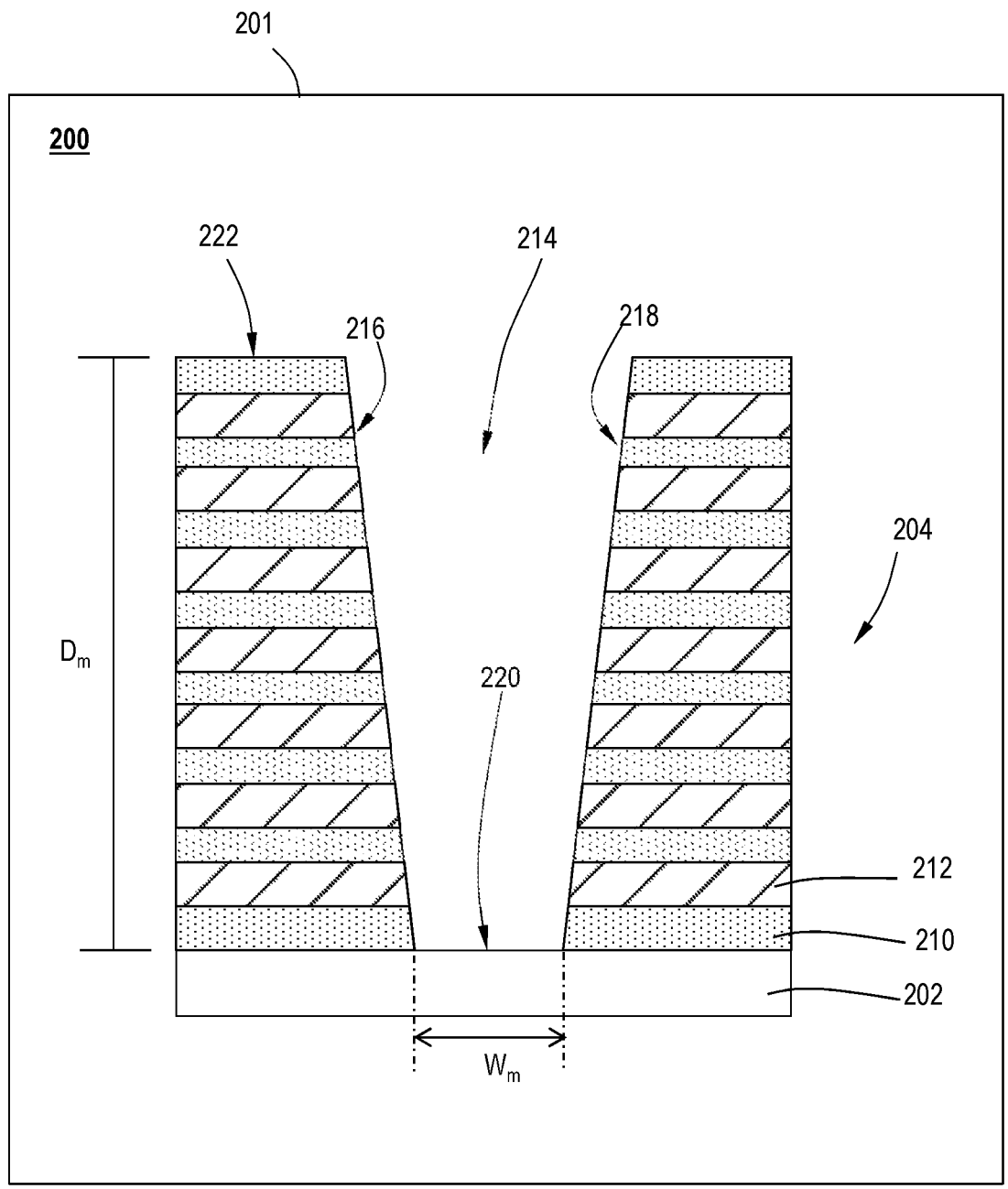
FIGS. 2A through 2E illustrate cross-sectional views of a substrate in accordance with one or more embodiments of the disclosure.
Figure 2B:
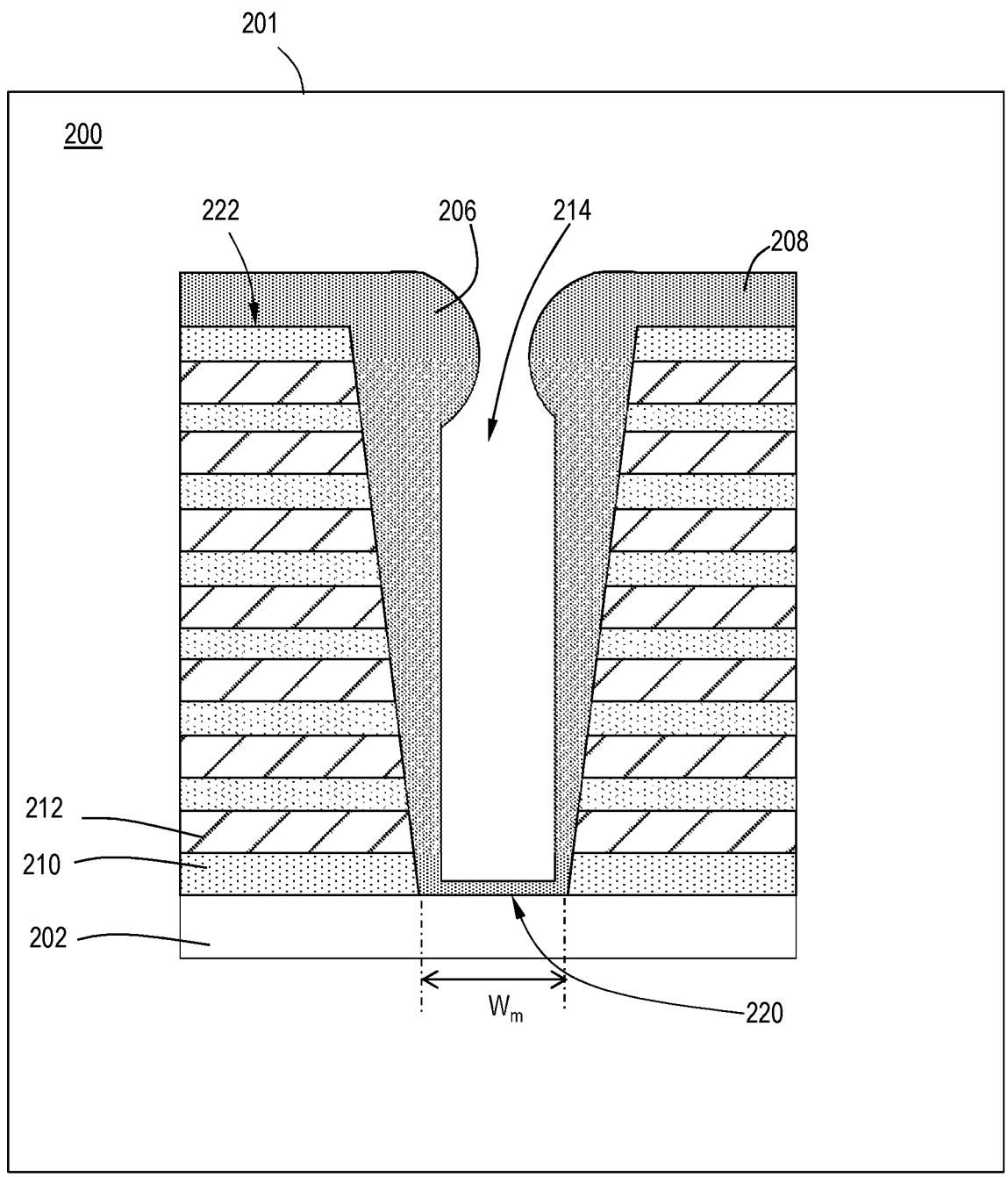
Figure 2C:
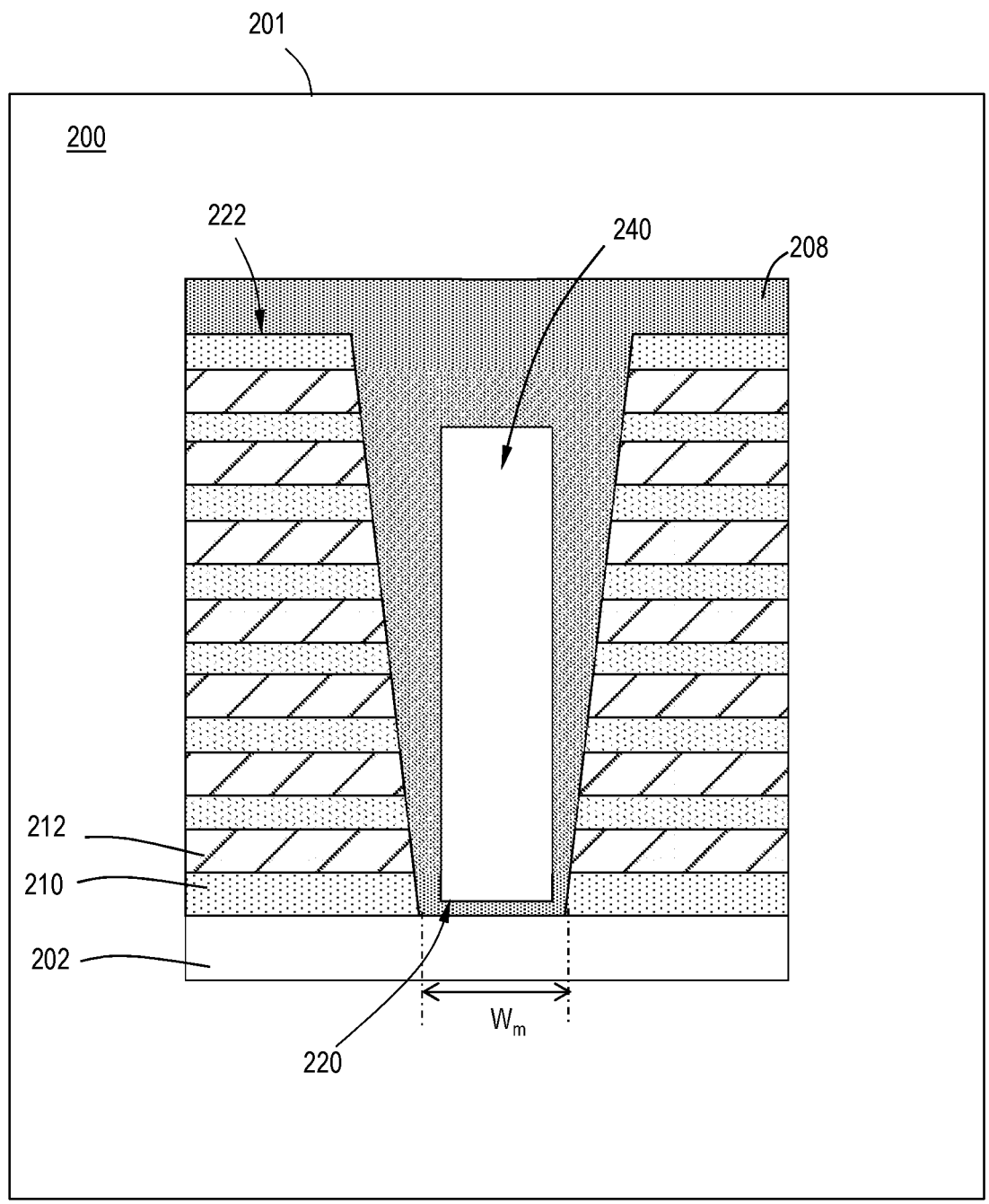
Figure 3:
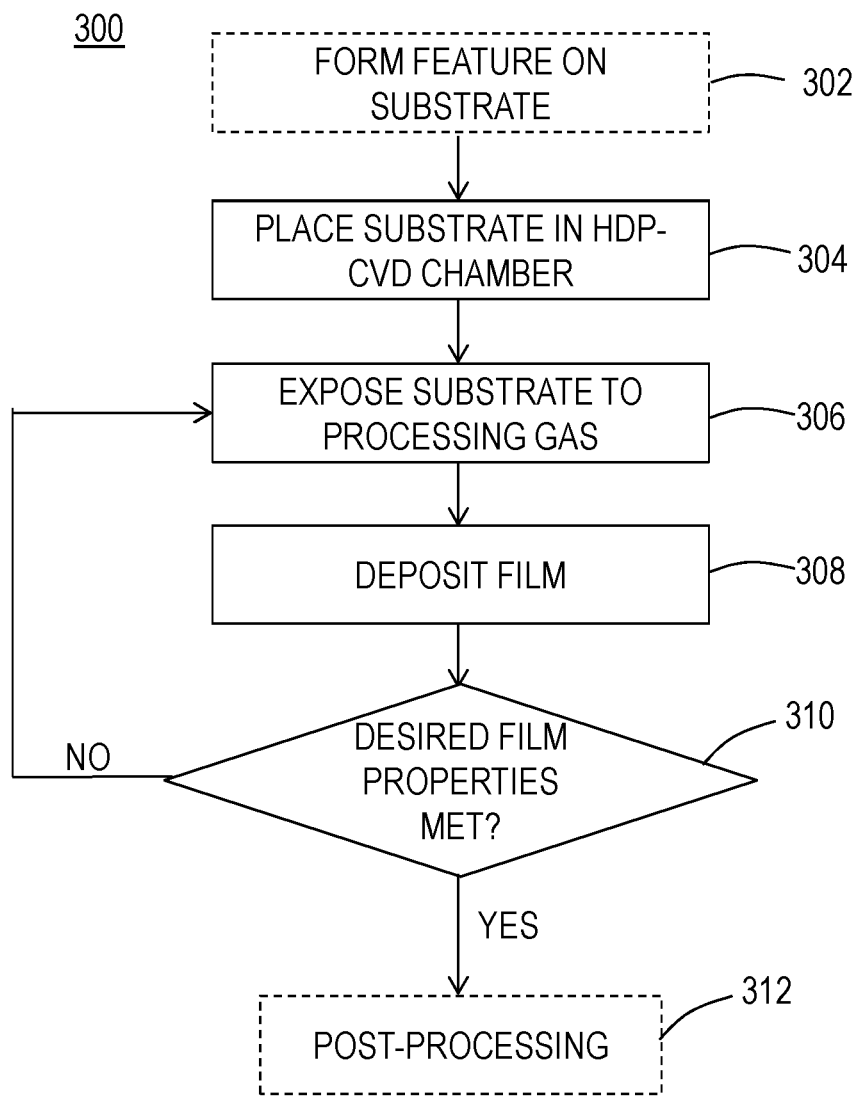
FIG. 3 illustrates a process flow in accordance with one or more embodiment of the disclosure.

FIGS. 2A to 2C illustrate partial cross-sectional views of processing a memory device 200, according to the method of one or more embodiments. FIG. 3 illustrates a process flow diagram of a processing method 300 in accordance with one or more embodiments of the disclosure. With reference to FIGS. 2A through 2C and FIG. 3, in one or more embodiments, at least one feature 214 is formed on a substrate 202. In some embodiments, the substrate 202 is provided for processing prior to operation 302. In one or more embodiments, the substrate 202 has at least one feature 214 already formed thereon. In other embodiments, at operation 302, at least one feature 214 is formed on a substrate 202. In one or more embodiments, the at least one feature extends a feature depth, $D_m$, from the substrate surface 222 to a bottom surface 220, the at least one feature having a width, $W_m$, defined by a first sidewall 216 and a second sidewall 218.

In one or more embodiments, at operation 304, the substrate 202 with the film stack 204 formed thereon is placed in an HDP-CVD chamber 201 for processing. In one or more embodiments, referring to FIG. 2B, a carbon film 208 is formed on the substrate surface 222 and the walls 216, 218 and the bottom 220 of the at least one feature 214.

In one or more embodiments, the carbon film 208 is formed by flowing a process gas into a high density plasma chemical vapor deposition (HDP-CVD) chamber 101. In one or more embodiments, the process gas comprises a hydrocarbon reactant having a hydrogen to carbon (H:C) ratio that is less than or equal to 2:1 and one or more of hydrogen ($H_2$), helium (He), and argon (Ar). In some embodiments, the process gas comprises a hydrocarbon reactant having a hydrogen to carbon (H:C) ratio that is less than or equal to 1:1.

In some embodiments, the hydrocarbon reactant comprises one or more of an alkene and an alkyne. As used herein, the term "alkene" refers to a hydrocarbon that contains a carbon-carbon double bond. An alkene is an acyclic hydrocarbon with just one double bond. As used herein, the term "alkyne" refers to an unsaturated hydrocarbon containing at least one carbon-carbon triple bond. In one or more embodiments, the hydrocarbon reactant is selected from the group consisting of acetylene ($C_2H_2$), propylene ($C_3H_6$), ethylene ($C_2H_4$), and methylacetylene ($C_3H_4$).

Non-limiting examples of the hydrocarbon process gases for depositing carbon films include acetylene ($C_2H_2$)/hydrogen ($H_2$)/helium (He)/argon (Ar), propylene ($C_3H_6$)/hydrogen ($H_2$)/helium (He)/argon (Ar), ethylene ($C_2H_4$)/hydrogen ($H_2$)/helium (He)/argon (Ar), and methylacetylene ($C_3H_4$)/hydrogen ($H_2$)/helium (He)/argon (Ar).

A carbon film 208 is then deposited in the memory hole 214 and forms on the sidewalls 216, 218, and bottom 220, but leaves a void 240 in the memory hole 214. According to various embodiments, filling the gap may be performed in a single deposition or in multiple depositions.

The void 240 is illustrated in FIG. 2C as a rectangular opening in the carbon film 208. Those skilled in the art, however, will understand that this is merely for illustrative purposes. The shape and size of the void 240 can vary.

In one or more embodiments, by using a hydrocarbon process gas in an HDP CVD deposition, gap fill may be provided. This is schematically represented in FIGS. 2A to 2C, which depict cross-sectional diagrams of a feature 214 filled with a carbon film 208 in a deposition stage using HDP-CVD. As the deposition proceeds, referring to FIG. 2B, a cusp 206 forms. This leads to the closing off of the top of the memory hole 214, which in turn results in a void 240. Without intending to be bound by theory, the memory hole 214 is filled and a void 240 is intentionally formed so that the carbon film 208 may be removed more easily later in the manufacture of the NAND device. The memory hole is a high aspect ratio structure, with a depth much larger than its width. If the memory hole 214 is completely filled with the carbon film 208, then it will take an extremely long time to remove the film and may damage the device during the removal. If the carbon film 208 is only on top of the memory hold 214, there is a void 240 below, solvent or plasma can permeate into the void 240 to make removal of the carbon film 208 easier.

In one or more embodiments, the hydrocarbon is flowed into the HDP-CVD processing chamber with a flow rate in a range of from about 10 sccm to about 150 sccm, including from about 15 sccm to about 135 sccm. Standard cubic centimeters per minute (sccm) is a unit of flow measurement indicating cubic centimeters per minute ($cm^3$/min) in standard conditions for temperature and pressure of a given fluid, typically a gas.

In one or more embodiments, argon (Ar) is introduced/flowed into the HDP-CVD chamber with a flow rate in a range of from about 40 sccm to about 60 sccm. In one or more embodiments, hydrogen ($H_2$) is introduced/flowed into the HDP-CVD chamber with a flow rate in a range of from about 0 sccm to about 500 sccm, including a range of from about 0 sccm to about 300 sccm, and from about 0 sccm to about 200 sccm. In one or more embodiments, helium (He) is introduced/flowed into the HDP-CVD chamber with a flow rate in a range of from about 0 sccm to about 500 sccm, and in a range of from about 0 sccm to about 300 sccm.

In one or more embodiments, the device 200 is processed at a temperature in a range of from about 400° C. to about 650° C., and at pressure of less than about 50 mTorr. In some embodiments, the pressure is less than about 40 mTorr, or less than about 30 mTorr, or less than about 20 mTorr, or less than about 10 mTorr.

In one or more embodiments, the carbon film 208 has excellent thermal stability. After annealing the carbon film 208 at a temperature greater than or equal to 800° C. for 1 hours, the carbon film 208 has shrinkage less than 20%. In some embodiments, the carbon film 208 has shrinkage less than 15%. In some embodiments, the carbon film 208 has shrinkage less than 10%.

As illustrated in FIG. 2C, in one or more embodiments, the carbon film 208 has a void 240 located within the width, $W_m$, of the at least one feature 214.

At decision point 310, it is determined whether the desired film properties of the carbon film 208 have been achieved. If the desired properties have been achieved, the device 200 is provided for further processing at operation 312. If the desired properties have not been achieved, the process returns to operation 306 where the substrate is exposed to the hydrocarbon processing gas once again.

Figure 2D:
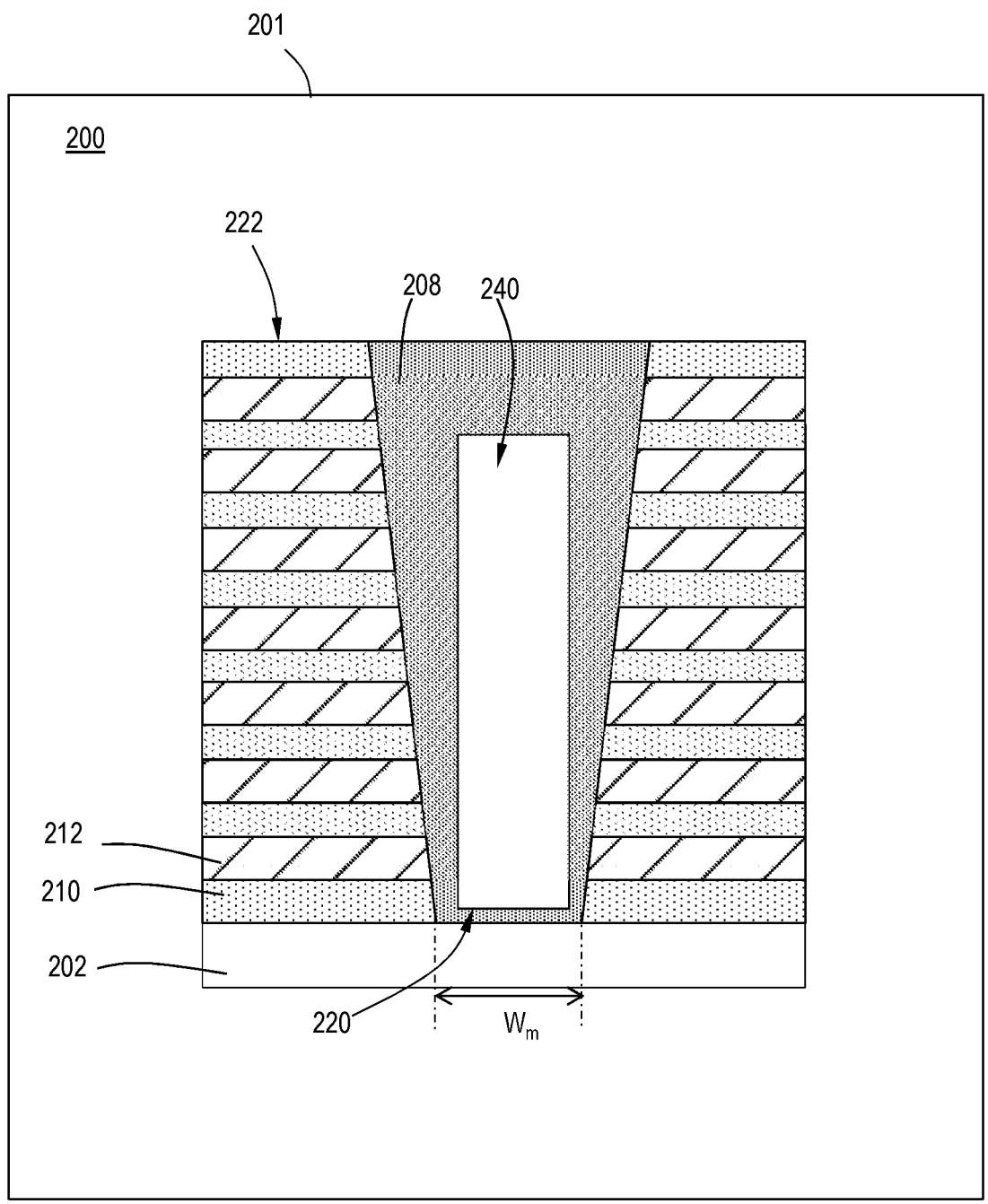
Figure 2E:
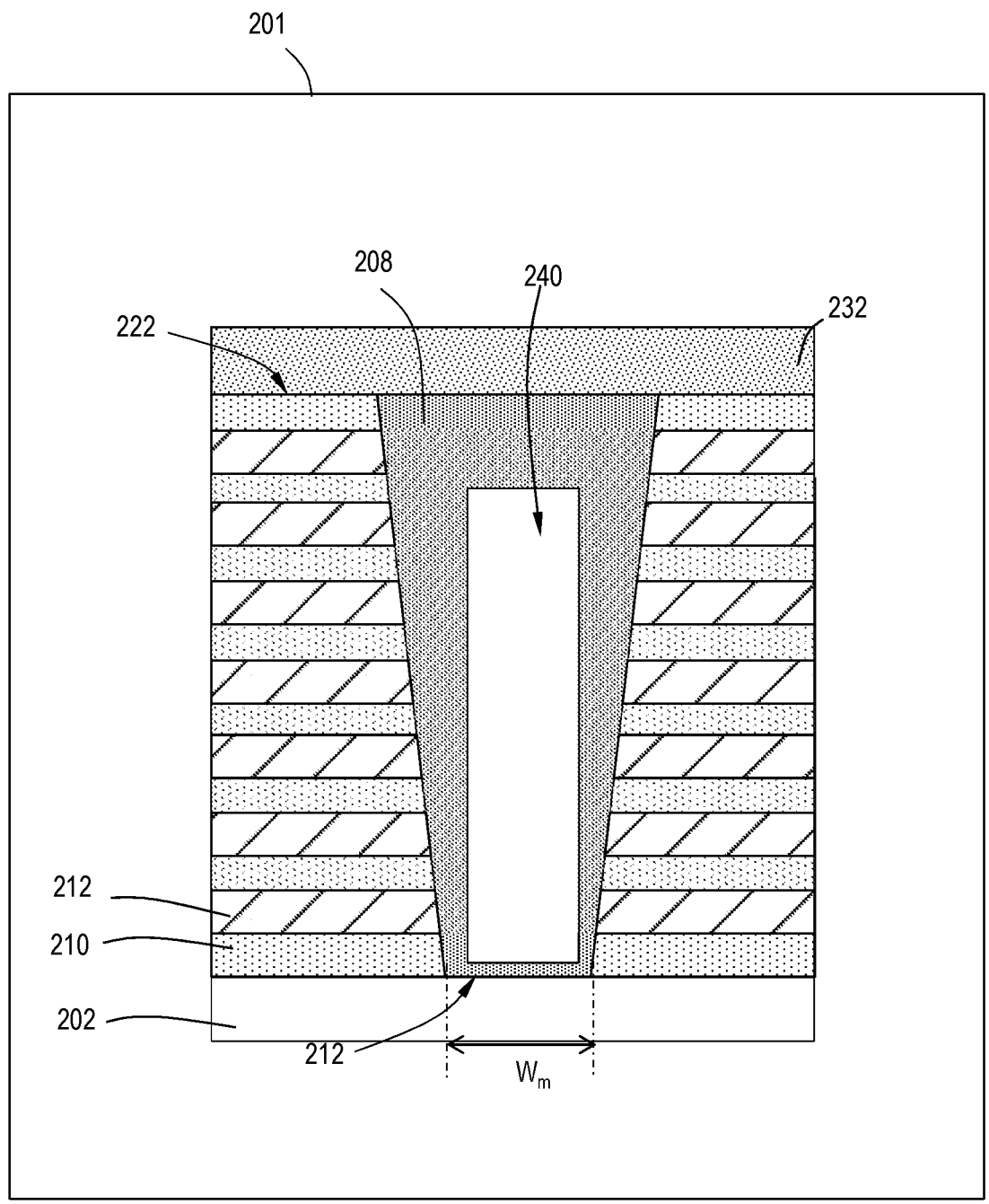

FIGS. 2D and 2E illustrate partial cross-sectional views of a memory device 200, according to one or more embodiments. At operation 312, the device 200 may be subjected to various post-processing methods. For example, referring to FIG. 2D, the carbon film 208 is etched or planarized such that the carbon film 208 is substantially coplanar with a top surface 222 of the device 200. The carbon film 208 may be etched or planarized by any suitable process known to one of skill in the art, including, but not limited to, chemical mechanical polishing (CMP), wet etching, plasma-based sputter etching, chemical etching, Siconi® etching, reactive ion etching (RIE), high density plasma (HDP) etching, and the like. In some embodiments, etching the carbon film 208 comprises exposing the carbon film 208 to an etch chemistry comprising one or more of $NF_3$, $Cl_2$, HBr, $C_4F_6$, $C_2F_4$, $H_2$, Ar, He or $N_2$. In one or more embodiments, the carbon film 208 is planarized by chemical mechanical polishing (CMP).

Referring to FIG. 2E, a film 232 is deposited on the top surface 222 and on a top surface of the carbon film 208. In one or more embodiments, the film 232 can be comprised of any suitable material. In some embodiments, the film 232 comprises one or more of silicon nitride (SiN) or silicon oxide ($SiO_x$). In one or more embodiments, the film 232 is formed by atomic layer deposition or plasma-enhanced chemical vapor deposition (PECVD). In one or more embodiments, the film 232 covers the gapfill carbon film 208 and reduces the shrinkage of the underlying gapfill carbon film 208 during anneal. It one or more embodiments, the film 232 may be removed after annealing.

According to one or more embodiments, the device 200 is subjected to processing prior to and/or after forming the layer. This processing can be performed in the same chamber or in one or more separate processing chambers.

The method of one or more embodiments may be implemented in a HDP-CVD reactor. Such a reactor may take many different forms. Generally, the apparatus will include one or more chambers or "reactors" (sometimes including multiple stations) that house one or more substrates and are suitable for substrate processing. Each chamber may house one or more substrates for processing. The one or more chambers maintain the substrate in a defined position or positions (with or without motion within that position, e.g. rotation, vibration, or other agitation). While in process, each substrate is held in place by a pedestal, vacuum chuck and/or electrostatic chuck. For certain operations in which the substrate is to be heated, the apparatus may include a heater such as a heating plate. An example of a suitable reactor is the CENTURA ULTIMA® HDP-CVD chambers/systems, available from Applied Materials, Inc. of Santa Clara, Calif.

Figure 4A:
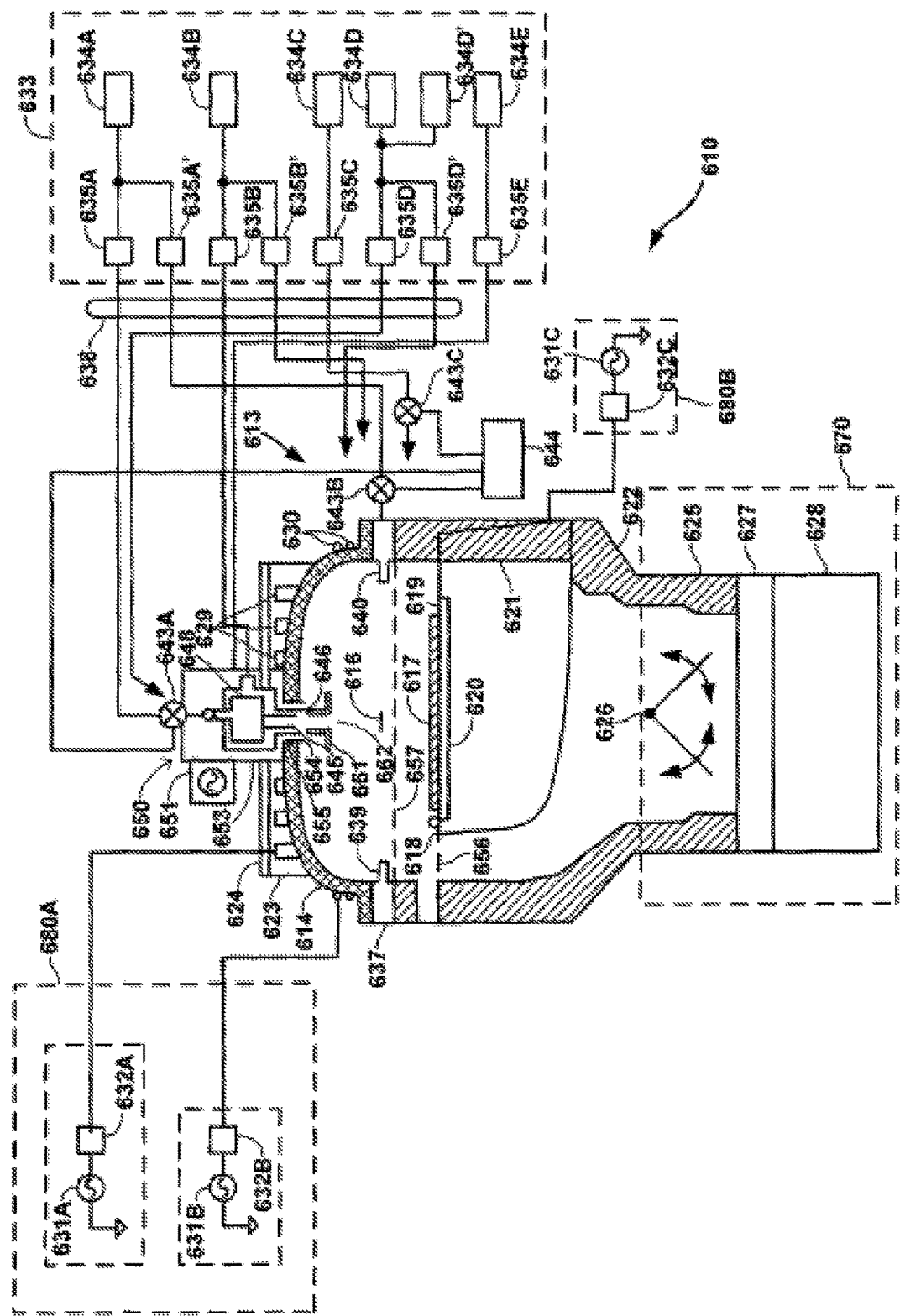
FIG. 4A illustrates a high-density plasma chemical vapor deposition (HDP-CVD) system according to one or more embodiments.
Figure 4B:
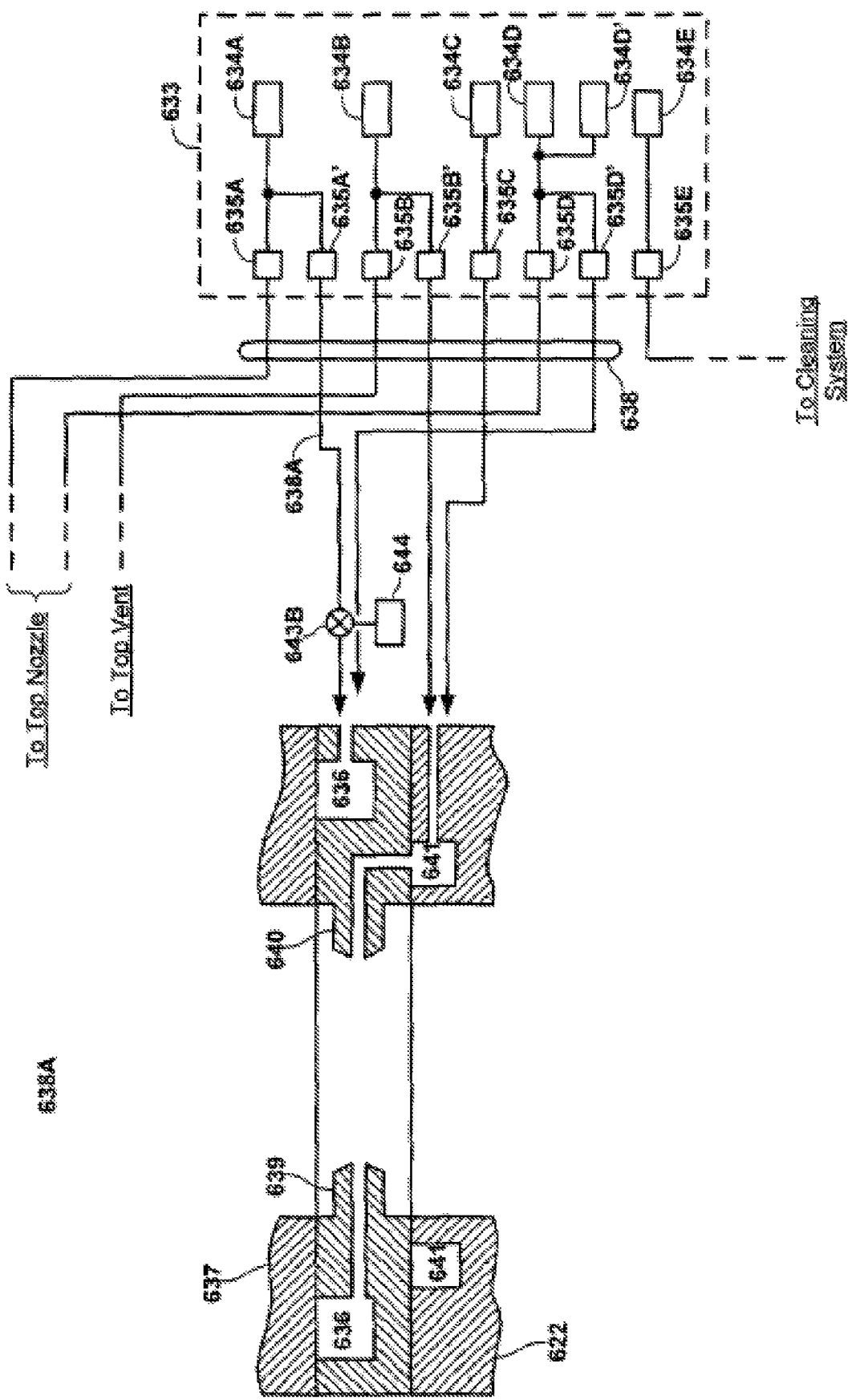
FIG. 4B illustrates a cross-sectional view of a gas ring that may be used in the high-density plasma chemical vapor deposition (HDP-CVD) of FIG. 4B.

An overview of an HDP-CVD chamber/system is provided in connection with FIGS. 4A and 4B below. FIG. 4A schematically illustrates the structure of such an HDP-CVD system 610 in one embodiment. The system 610 includes a chamber 613, a vacuum system 670, a source plasma system 680A, a substrate bias plasma system 680B, a gas delivery system 633, and a remote plasma cleaning system 650.

The upper portion of chamber 613 includes a dome 614, which is made of a ceramic dielectric material, such as aluminum oxide or aluminum nitride. Dome 614 defines an upper boundary of a plasma processing region 616. Plasma processing region 616 is bounded on the bottom by the upper surface of a substrate 617 and a substrate support member 618.

A heater plate 623 and a cold plate 624 surmount, and are thermally coupled to, dome 614. Heater plate 623 and cold plate 624 allow control of the dome temperature to within about ±10° C. over a range of about 400° C. to about 650° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 613 includes a body member 622, which joins the chamber to the vacuum system. A base portion 621 of substrate support member 618 is mounted on, and forms a continuous inner surface with, body member 622. Substrates are transferred into and out of chamber 613 by a robot blade (not shown) through an insertion/removal opening (not shown) in the side of chamber 613. Lift pins (not shown) are raised and then lowered under the control of a motor (also not shown) to move the substrate from the robot blade at an upper loading position 657 to a lower processing position 656 in which the substrate is placed on a substrate receiving portion 619 of substrate support member 618. Substrate receiving portion 619 includes an electrostatic chuck 620 that secures the substrate to substrate support member 618 during substrate processing. In a specific embodiment, substrate support member 618 is made from an aluminum oxide or aluminum ceramic material.

Vacuum system 670 includes throttle body 625, which houses twin-blade throttle valve 626 and is attached to gate valve 627 and turbo-molecular pump 628. It should be noted that throttle body 625 offers minimum obstruction to gas flow, and allows symmetric pumping. Gate valve 627 can isolate pump 628 from throttle body 625, and can also control chamber pressure by restricting the exhaust flow capacity when throttle valve 626 is fully open. The arrangement of the throttle valve, gate valve, and turbo-molecular pump allow accurate and stable control of chamber pressures up to about 1 millitorr to about 2 torr.

The source plasma system 680A includes a top coil 629 and side coil 630, mounted on dome 614. A symmetrical ground shield (not shown) reduces electrical coupling between the coils. Top coil 629 is powered by top source RF (SRF) generator 631A, whereas side coil 630 is powered by side SRF generator 631B, allowing independent power levels and frequencies of operation for each coil. This dual coil system allows control of the radial ion density in chamber 613, thereby improving plasma uniformity. Side coil 630 and top coil 629 are typically inductively driven, which does not require a complimentary electrode. In a specific embodiment, the top source RF generator 631A provides up to 10,000 watts of RF power at nominally 2 MHz and the side source RF 60 generator 631B provides up to 10,500 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A substrate bias plasma system 680B includes a bias RF ("BRF") generator 631C and a bias matching network 632C. The bias plasma system 680B capacitively couples substrate portion 617 to body member 622, which act as complimentary electrodes. The bias plasma system 680B serves to enhance the transport of plasma species (e.g., ions) created by the source plasma system 680A to the surface of the substrate. In a specific embodiment, the substrate bias RF generator provides up to 10,000 watts of RF power at a frequency of about 13.56 MHz.

RF generators 631A and 631B include digitally controlled synthesizers. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 Ohms to over 900 Ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 632A and 632B match the output impedance of generators 631A and 631B with their respective coils 629 and 630. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

A gas delivery system 633 provides gases from several sources, 634A-634E to a chamber for processing the substrate by way of gas delivery lines 638 (only some of which are shown). As would be understood by a person of skill in the art, the actual sources used for sources 634A-634E and the actual connection of delivery lines 638 to chamber 613 varies depending on the deposition and cleaning processes executed within chamber 613. Gases are introduced into chamber 613 through a gas ring 637 and/or a top nozzle 645. FIG. 4B is a simplified, partial cross-sectional view of chamber 613 showing additional details of gas ring 637.

In one embodiment, first and second gas sources, 634A and 634B, and first and second gas flow controllers, 635A' and 6356', provide gas to ring plenum 636 in gas ring 637 by way of gas delivery lines 638 (only some of which are shown). Gas ring 637 has a plurality of source gas nozzles 639 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a specific embodiment, gas ring 637 has 12 source gas nozzles made from an aluminum oxide ceramic.

Gas ring 637 also has a plurality of oxidizer gas nozzles 640 (only one of which is shown), which in one embodiment are co-planar with and shorter than source gas nozzles 639, and in one embodiment receive gas from body plenum 641. In some embodiments it is desirable not to mix source gases and oxidizer gases before injecting the gases into chamber 613. In other embodiments, oxidizer gas and source gas may be mixed prior to injecting the gases into chamber 613 by providing apertures (not shown) between body plenum 641 and gas ring plenum 636. In one embodiment, third, fourth, and fifth gas sources, 634C, 634D, and 634D', and third and fourth gas flow controllers, 635C and 635D', provide gas to body plenum by way of gas delivery lines 638. Additional valves, such as 643B (other valves not shown), may shut off gas from the flow controllers to the chamber. In implementing certain embodiments of the invention, source 634A comprises a hydrocarbon source, source 634B comprises a molecular hydrogen ($H_2$) source, source 634C comprises a helium (He) source, and source 634D comprises an argon (A)r source.

In embodiments where flammable, toxic, or corrosive gases are used, it may be desirable to eliminate gas remaining in the gas delivery lines after a deposition. This may be accomplished using a 3-way valve, such as valve 643B, to isolate chamber 613 from delivery line 638A and to vent delivery line 638A to vacuum foreline 644, for example. As shown in FIG. 4A, other similar valves, such as 643A and 643C, may be incorporated on other gas delivery lines. Such three-way valves may be placed as close to chamber 613 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 4A, chamber 613 also has top nozzle 645 and top vent 646. Top nozzle 645 and top vent 646 allow independent control of top and side flows of the gases, which improves film uniformity and allows fine adjustment of the film's deposition and doping parameters. Top vent 646 is an annular opening around top nozzle 645. In one embodiment, first gas source 634A supplies source gas nozzles 639 and top nozzle 645. Source nozzle MFC 635A' controls the amount of gas delivered to source gas nozzles 639 and top nozzle MFC 635A controls the amount of gas delivered to top gas nozzle 645. Similarly, two MFCs 635B and 635B' may be used to control the flow of oxygen to both top vent 646 and oxidizer gas nozzles 640 from a single source of oxygen, such as source 634B. In some embodiments, oxygen is not supplied to the chamber from any side nozzles. The gases supplied to top nozzle 645 and top vent 646 may be kept separate prior to flowing the gases into chamber 613, or the gases may be mixed in top plenum 648 before they flow into chamber 613. Separate sources of the same gas may be used to supply various portions of the chamber.

A remote microwave-generated plasma cleaning system 650 is provided to periodically clean deposition residues from chamber components. The cleaning system includes a remote microwave generator 651 that creates a plasma from a cleaning gas source 634E (e.g., molecular fluorine, nitrogen trifluoride, other fluorocarbons or equivalents) in reactor cavity 653. The reactive species resulting from this plasma are conveyed to chamber 613 through cleaning gas feed port 654 by way of applicator tube 655. The materials used to contain the cleaning plasma (e.g., cavity 653 and applicator tube 655) must be resistant to attack by the plasma. The distance between reactor cavity 653 and feed port 654 should be kept as short as practical, since the concentration of desirable plasma species may decline with distance from reactor cavity 653. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 620, do not need to be covered with a dummy wafer or otherwise protected, as may be required with an in situ plasma cleaning process. In FIG. 4A, the plasma-cleaning system 650 is shown disposed above the chamber 613, although other positions may alternatively be used.

A baffle 661 may be provided proximate the top nozzle to direct flows of source gases supplied through the top nozzle into the chamber and to direct flows of remotely generated plasma. Source gases provided through top nozzle 645 are directed through a central passage 662 into the chamber, while remotely generated plasma species provided through the cleaning gas feed port 654 are directed to the sides of the chamber 613 by the baffle 661.

EXAMPLES

Example 1

A substrate having an oxy/nitride film stack with a memory hole was placed in a HDP CVD processing chamber. A process gas of $He/Ar/C_2H_2$ was flowed into the processing chamber. The substrate was kept at temperature of 500° C. at a pressure of 3 mTorr. A plasma was generated using an RF source. A layer of amorphous carbon (a-C) was formed on the substrate in the memory hole. A void was left in the memory hole. The substrate was annealed at a temperature of 800° C. for 1 hour. The carbon film survived the 800° C. anneal with ≥25% shrinkage.

Example 2

A substrate having an oxy/nitride film stack with a memory hole was placed in a HDP CVD processing chamber. A process gas of $He/Ar/C_2H_2$ was flowed into the processing chamber. The substrate was kept at temperature of 550° C. at a pressure of 10 mTorr. A plasma was generated using an RF source. A layer of amorphous carbon (a-C) was formed on the substrate in the memory hole. A void was left in the memory hole. The substrate was annealed at a temperature of 800° C. for 1 hour. The carbon film survived the 800° C. anneal with 15.5% shrinkage.

Example 3

A substrate having an oxy/nitride film stack with a memory hole was placed in a HDP CVD processing chamber. A process gas of $H_2/He/Ar/C_2H_2$ was flowed into the processing chamber. The substrate was kept at temperature of 592° C. at a pressure of 4.2 mTorr. A plasma was generated using an RF source. A layer of amorphous carbon (a-C) was formed on the substrate in the memory hole. A void was left in the memory hole. The substrate was annealed at a temperature of 800° C. for 1 hour. The carbon film survived the 800° C. anneal with <10% shrinkage.

The process of Example 3 has more process margin than the process of Example 1 an Example 2, in terms of stress, gap fill and thermal stability. The carbon film formed in Example 3 exhibits <10% shrinkage after 800° C. 1 h annealing.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a film, the method comprising:
flowing a process gas into a high density plasma chemical vapor deposition (HDP-CVD) chamber, the chamber housing a substrate having at least one feature, the process gas comprising a hydrocarbon reactant having a hydrogen to carbon (H:C) ratio that is less than or equal to 2:1 and one or more of hydrogen ($H_2$), helium (He), and argon (Ar), the substrate processed at a temperature in a range of from about 400° C. to about 650° C. and a pressure of less than about 20 mTorr;
generating a plasma having a density greater than $10^{17}$ ions/$m^3$; and
depositing a carbon film in the at least one feature, the carbon film having a void in the at least one feature.

2. The method of claim 1, wherein the hydrocarbon reactant comprises one or more of an alkene and an alkyne.

3. The method of claim 2, wherein the hydrocarbon reactant is selected from the group consisting of acetylene ($C_2H_2$), propylene ($C_3H_6$), ethylene ($C_2H_4$), and methylacetylene ($C_3H_4$).

4. The method of claim 1, wherein the carbon film comprises an amorphous carbon (a-C) film.

5. The method of claim 1, wherein the at least one feature is selected from one or more of a trench, a via, a word-line slit, and a memory hole.

6. The method of claim 5, wherein the at least one feature has an aspect ratio greater than or equal to about 50:1.

7. The method of claim 5, wherein the at least one feature extends a feature depth from a top surface of the substrate to a bottom surface and has a width defined by a first sidewall and a second sidewall, and wherein the carbon film is deposited on the top surface, the first sidewall, the second sidewall, and the bottom surface and the void is located within the width of the at least one feature at a first distance from the bottom surface of the feature.

8. A method of forming a film, the method comprising:
flowing a process gas into a high density plasma chemical vapor deposition (HDP-CVD) chamber, the chamber housing a substrate having a substrate surface, the process gas comprising a hydrocarbon reactant having a hydrogen to carbon (H:C) ratio that is less than or equal to 2:1 and one or more of hydrogen ($H_2$), helium (He), and argon (Ar), the substrate processed at a temperature in a range of from about 400° C. to about 650° C. and a pressure of less than about 20 mTorr;
generating a plasma having a density greater than $10^{17}$ ions/$m^3$; and
depositing a carbon film on the substrate surface, the substrate surface having at least one feature thereon, the at least one feature extending a depth from the substrate surface to a bottom surface, the at least one feature having a width defined by a first sidewall and a second sidewall, wherein the carbon film is deposited on the substrate surface, the first sidewall, the second sidewall, and the bottom surface of the at least one feature, the carbon film having a void located within the width of the feature at a first distance from the bottom surface of the feature.

9. The method of claim 8, further comprising etching or planarizing the carbon film such that the carbon film is substantially coplanar with the substrate surface, and depositing a second film on the substrate surface and on a top surface of the carbon film, the second film comprises one or more of silicon nitride (SiN) or silicon oxide ($SiO_x$).

10. The method of claim 8, wherein the hydrocarbon reactant is selected from the group consisting of acetylene ($C_2H_2$), propylene ($C_3H_6$), ethylene ($C_2H_4$), and methylacetylene ($C_3H_4$).

11. The method of claim 8, wherein the carbon film comprises an amorphous carbon (a-C) film.

12. The method of claim 9, further comprising annealing the substrate, wherein the second film reduces shrinkage of carbon film during anneal.

13. The method of claim 8, wherein the feature has an aspect ratio greater than or equal to about 10:1.

14. The method of claim 8, wherein the depth of the at least one feature is in a range of about 50 nm to about 10000 nm.

15. A method of manufacturing a memory device, the method comprising:
forming a film stack on a substrate, the film stack comprising a plurality of alternating layers of first material and a second material and the film stack having a stack thickness;
etching the film stack to form a memory hole opening extending a depth from a top surface of the film stack to a bottom surface, the memory hole opening having a width defined by a first sidewall and a second sidewall;
loading the substrate into a high density plasma chemical vapor deposition (HDP-CVD) chamber;
flowing a process gas into the high density plasma chemical vapor deposition (HDP-CVD) chamber, the process gas comprising a hydrocarbon reactant having a hydrogen to carbon (H:C) ratio that is less than or equal to 2:1 and one or more of hydrogen ($H_2$), helium (He), and argon (Ar), the substrate being processed at a temperature in a range of from about 400° C. to about 650° C., a pressure of less than about 20 mTorr, and at a plasma density greater than $10^{17}$ ions/m$^3$; and
depositing a carbon film on the top surface of the film stack, and on the first sidewall, the second sidewall, and the bottom surface of the memory hole opening, the carbon film having a void located within the width of the memory hole opening at a first distance from the bottom surface of the memory hole opening.

16. The method of claim 15, further comprising etching or planarizing the carbon film such that the carbon film is substantially coplanar with the top surface of the film stack, and depositing a second film on the top surface of the film stack and on a top surface of the carbon film.

17. The method of claim 15, wherein the hydrocarbon reactant is selected from the group consisting of acetylene ($C_2H_2$), propylene ($C_3H_6$), ethylene ($C_2H_4$), and methylacetylene ($C_3H_4$).

18. The method of claim 16, wherein the second film comprises one or more of silicon nitride (SiN) or silicon oxide ($SiO_x$).

19. The method of claim 15, wherein the first material and the second material independently comprise one or more of an oxide material, a nitride material, and a poly silicon material.

* * * * *

UNITED STATES PATENT AND TRADEMARK OFFICE
CERTIFICATE OF CORRECTION

| | |
|---|---|
| PATENT NO. | : 11,655,537 B2 |
| APPLICATION NO. | : 17/079630 |
| DATED | : May 23, 2023 |
| INVENTOR(S) | : Zeqing Shen et al. |

It is certified that error appears in the above-identified patent and that said Letters Patent is hereby corrected as shown below:

In the Specification

•Column 12, Line 26, replace "6326" after "and" and before "match" with "632B".

•Column 12, Line 58, replace "6356'" after "and" and before ", provide" with "635B'".

Signed and Sealed this
Twenty-seventh Day of June, 2023

Katherine Kelly Vidal
*Director of the United States Patent and Trademark Office*